United States Patent
Li

(10) Patent No.: US 7,570,472 B2
(45) Date of Patent: Aug. 4, 2009

(54) PROTECTION CIRCUIT FOR AVOIDING USING OF AN IMPROPER ALTERNATING CURRENT POWER SOURCE

(75) Inventor: Sheng Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 555 days.

(21) Appl. No.: 11/288,689

(22) Filed: Nov. 28, 2005

(65) Prior Publication Data

US 2006/0114631 A1    Jun. 1, 2006

(30) Foreign Application Priority Data

Nov. 26, 2004    (CN) .................. 2004 1 0052542

(51) Int. Cl.
*H02H 7/00*    (2006.01)
(52) U.S. Cl. ....................................... 361/90
(58) Field of Classification Search ............. 361/90
See application file for complete search history.

(56) References Cited

U.S. PATENT DOCUMENTS

| | | | |
|---|---|---|---|
| 3,200,390 A * | 8/1965 | Lukoff et al. ........... | 340/662 |
| 4,331,996 A * | 5/1982 | Matsko et al. .......... | 361/92 |
| 6,223,296 B1 * | 4/2001 | Lin ...................... | 713/320 |
| 6,885,531 B2 | 4/2005 | Tang | |

FOREIGN PATENT DOCUMENTS

CN    2031583 U    1/1989

* cited by examiner

*Primary Examiner*—Stephen W Jackson

(57) ABSTRACT

A protection circuit for avoiding the use of an improper alternating current source includes: a rectifier circuit; a voltage comparator circuit having a first input terminal, a second input terminal, and an output terminal; a sampler and filter circuit; an alarm circuit connected to the output terminal of the voltage comparator circuit; and a switch control circuit. The rectifier receives a voltage from an external AC power and outputs a single-direction pulsed voltage. The sampler and filter circuit includes an input terminal connected to an output terminal of the rectifier circuit, and an output terminal connected to the first input terminal of the voltage comparator circuit. The switch control circuit enabled or disenabled by means of a control signal received from the voltage comparator circuit. One of the input terminals of the voltage comparator circuit accepts a constant reference voltage.

15 Claims, 5 Drawing Sheets

PROTECTION CIRCUIT FOR AVOIDING USING OF AN IMPROPER ALTERNATING CURRENT POWER SOURCE

BACKGROUND OF THE INVENTION

1. Field of the Invention

The present invention relates to a protection circuit, and more particularly to a protection circuit to aid in avoiding the use of an inappropriate Alternating Current (AC) power source.

2. Background of the Invention

A piece of equipment known as Automatic Test Equipment (ATE) is used for testing function of various print circuit boards (PCB). Referring to FIG. 1, a typical ATE includes a voltage transforming circuit 100 with a commutating circuit inside, a control circuit 120, a switch circuit 140 and a magnet valve 160. AC voltage from an external AC power source is transformed and commutated by the voltage transforming circuit 100 to provide a working voltage to the control circuit 120. The control circuit 120 outputs a control signal to the switch circuit 140, thereby setting the condition of the switch circuit 140 to be switched on or off. When the switch circuit 140 is on, the magnet valve 160 connects to the AC power and in turn controls other components of the ATE to test the PCB. Otherwise, the magnet valve 160 is not connected to the AC power.

Generally a magnet valve 160 functions using either 220V or 110V AC power but not both. The magnet valve 160 will perform abnormal when it is connected to an improper AC power source. For instance, a magnet valve 160 for use with a 110V AC power source will be fused when connected to a 220V AC power. Conversely, a magnet valve 160 for use with a 220V AC power source cannot function normally when connected to a 110V AC power source.

Accordingly, what is needed is a protection circuit for avoiding the use of an improper AC power source.

SUMMARY OF THE INVENTION

A protection circuit for avoiding the use of an improper alternating current source includes: a rectifier circuit; a voltage comparator circuit having a first input terminal, a second input terminal, and an output terminal; a sampler and filter circuit; an alarm circuit connected to the output terminal of the voltage comparator circuit; and a switch control circuit. The rectifier receives a voltage from an external AC power and outputs a single-direction pulsed voltage. The sampler and filter circuit includes an input terminal connected to an output terminal of the rectifier circuit, and an output terminal connected to the first input terminal of the voltage comparator circuit. The switch control circuit enabled or disenabled by means of a control signal received from the voltage comparator circuit. One of the input terminals of the voltage comparator circuit accepts a constant reference voltage.

Other advantages and novel features will be drawn from the following detailed description of preferred embodiments with attached drawings, in which:

DETAIL DESCRIPTION OF THE INVENTION

Figure 1:
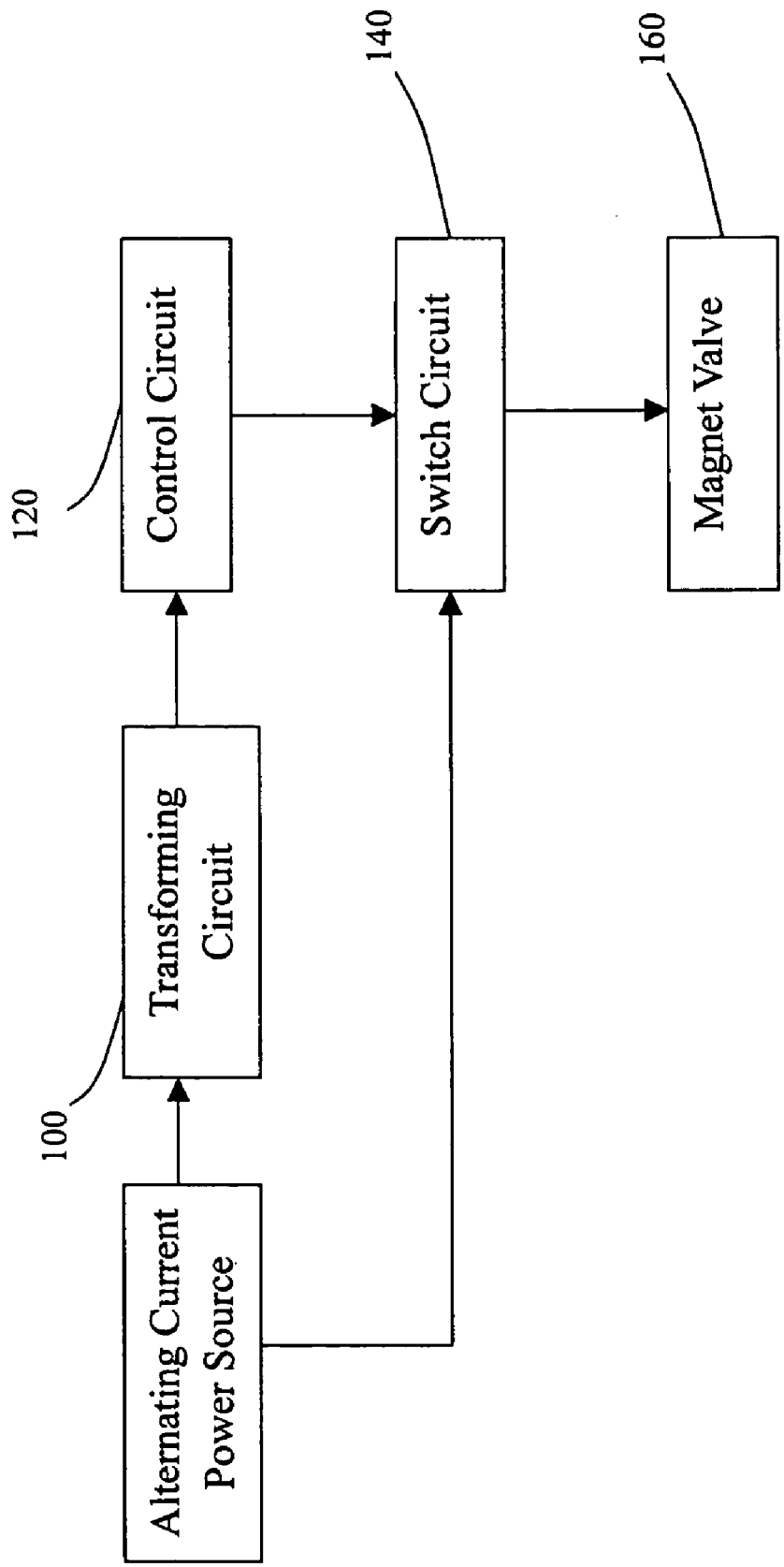
FIG. 1 is a block diagram of a conventional ATE.
Figure 2:
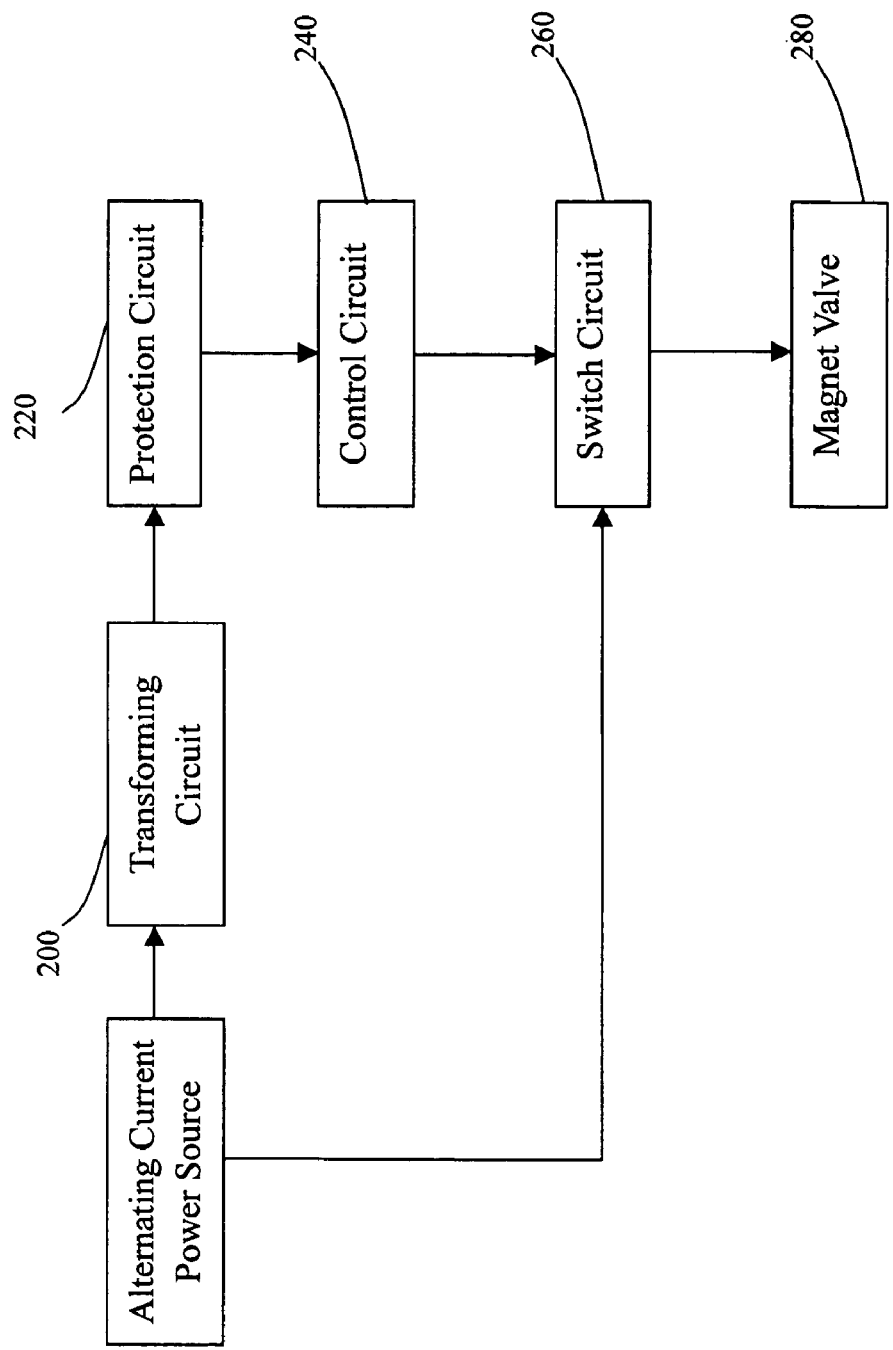
FIG. 2 is a block diagram of an ATE having a protection circuit for avoiding the use of an improper AC power in accordance with a preferred embodiment of the present invention.

Referring to FIG. 2, an ATE includes a voltage transforming circuit 200 without a commutating circuit, a protection circuit 220, a control circuit 240, a switch circuit 260 and a magnet valve 280. The protection circuit 220 is connected between the transforming circuit 200 and the control circuit 240.

Figure 3:
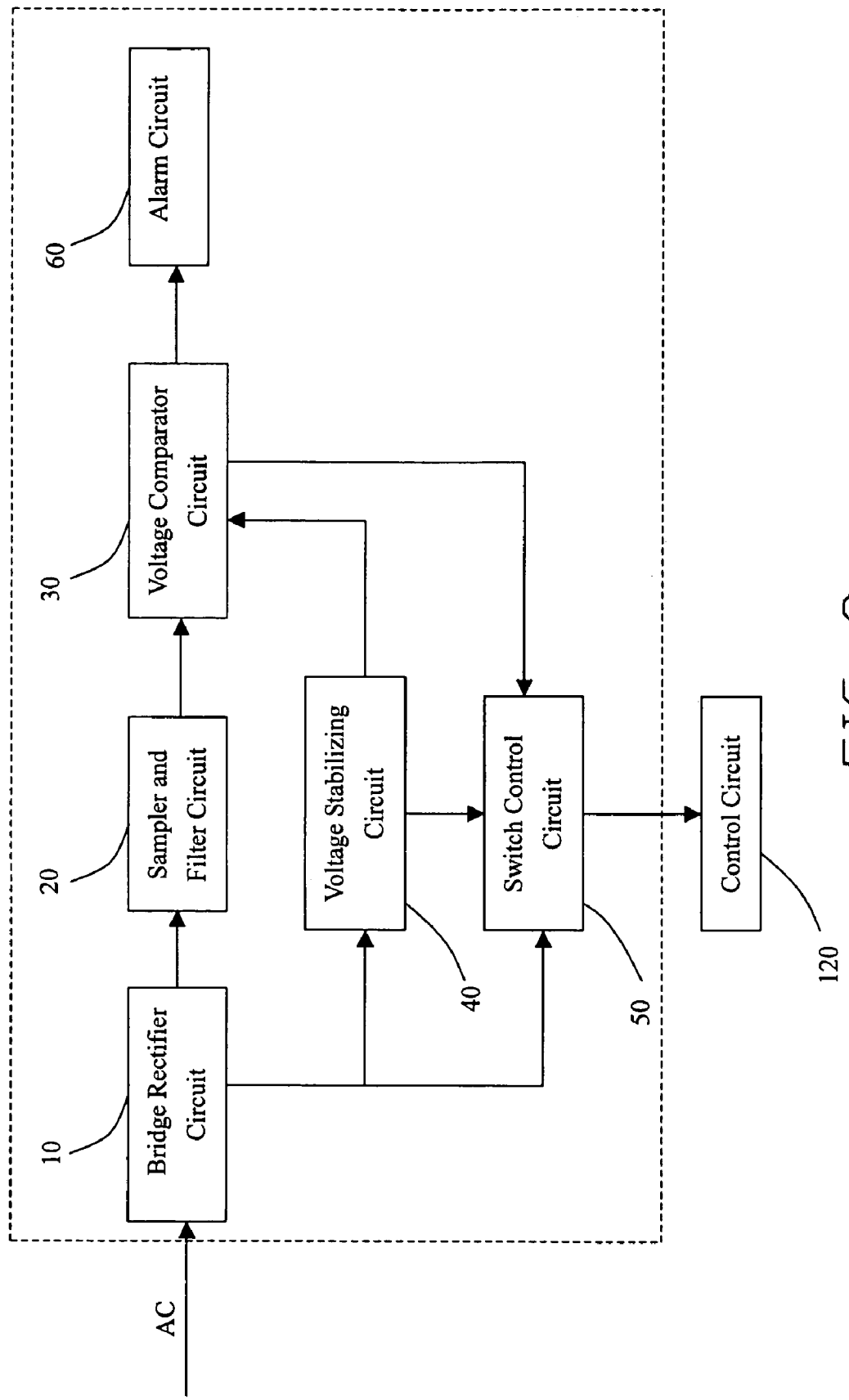
FIG. 3 is a block diagram of the protection circuit for avoiding the use of an improper AC power in accordance with a preferred embodiment of the present invention.
Figure 4:
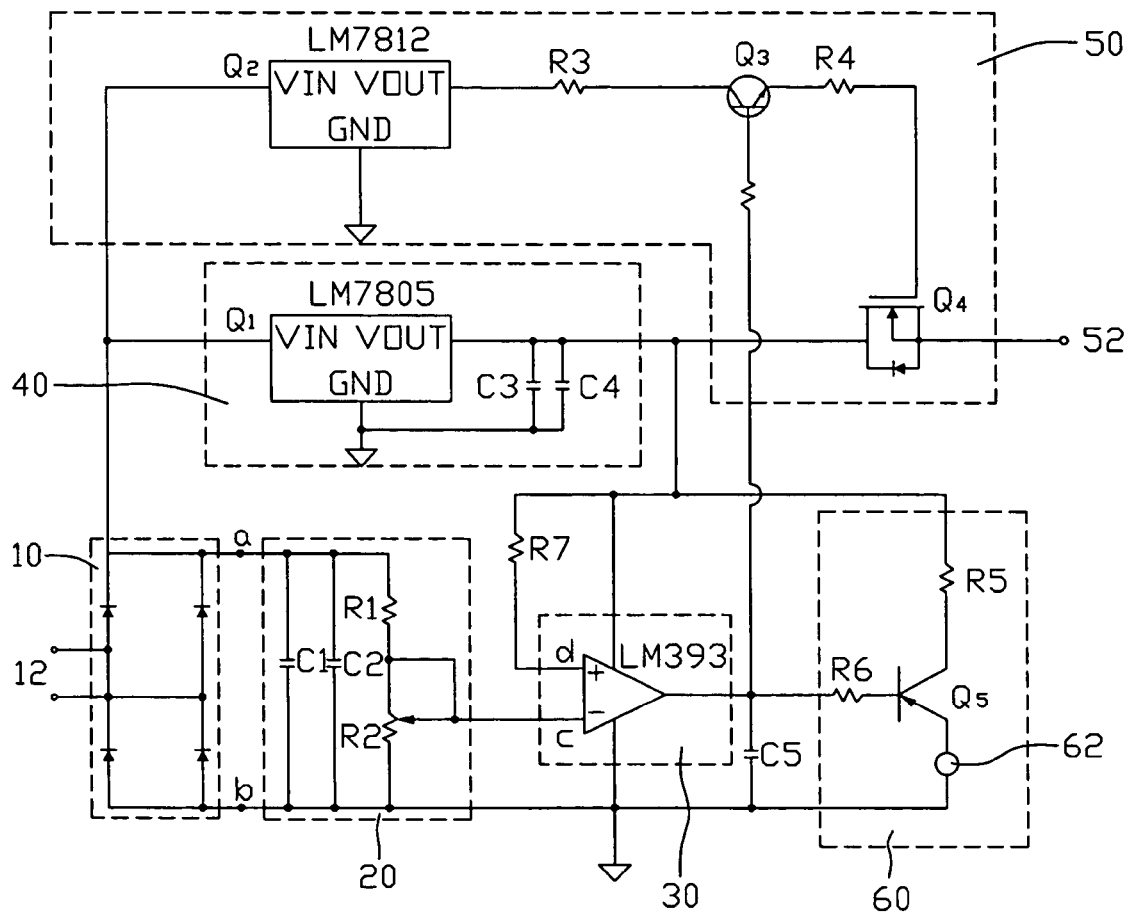
FIG. 4 is a circuit diagram of the protection circuit of FIG. 3.

Referring to FIGS. 3 and 4, details of the protection circuit 220 are illustrated. The protection circuit 220 is for avoiding use of a too powerful AC power source. The protection circuit 220 includes a bridge rectifier circuit 10, a sampler and filter circuit 20, a voltage comparator circuit 30, a voltage stabilizing circuit 40, a switch control circuit 50, and an alarm circuit 60.

An input terminal 12 of the bridge rectifier circuit 10 receives AC power from the transforming circuit 200 and rectifies it to single direction pulsed voltage, and then the pulsed voltage is provided to the sampler and filter circuit 20.

The sampler and filter circuit 20 includes two shunt-wound filter capacitors C1 and C2 connected between two output terminals "a" and "b", for transforming the pulsed voltage into direct current (DC). A sharing voltage resistor R1 and a changeable resistor R2 are connected in series between the output terminals "a" and "b". A negative terminal "c" of the voltage comparator circuit 30 receives output from a sliding terminal of the changeable resistor R2.

The voltage stabilizing circuit 40 includes a manostat Q1 and two shunt-wound capacitors C3 and C4 connected between the output terminal of the manostat Q1 and ground. The input terminal of the voltage stabilizing circuit 40 receives a voltage from the bridge rectifier 10. The voltage stabilizing circuit 40 outputs a constant reference voltage via a resistor R7 to a positive terminal "d" of the voltage comparator circuit 30.

The switch control circuit 50 includes a manostat Q2, a transistor Q3 and a field effect transistor (FET) Q4. A constant voltage from the manostat Q2 through a resistor R3 is received by the collector electrode of the transistor Q3. The base electrode of the transistor Q3 accepts a voltage output from the voltage comparator circuit 30. The emitter electrode of the transistor Q3 is connected to the grid electrode of the FET Q4 through a resistor R4. The source electrode of the FET Q4 receives a constant voltage from the voltage stabilizing circuit 40. An output terminal 52 of the protection circuit 50 derives from the drain electrode of the FET Q4.

The alarm circuit 60 includes a transistor Q5 and an annunciator 62. The base electrode of the transistor Q5 is connected to the output terminal of the voltage comparator circuit 30 through a resistor R6. The collector electrode of the transistor Q5 is connected to the output terminal of the voltage stabilizing circuit 40 through a resistor R5. The emitter electrode of the transistor Q5 is connected to the input terminal of the annunciator 62.

The following description relates to the situation where the protection circuit 220 is used for controlling a magnet valve 60 working at 110V AC. The protection circuit 220 is set to function when connected to 110V AC, and goes into an alarm status when connected to 220V AC. Prior to connecting the protection circuit 220 to the ATE, the changeable resistor R2 of the sampler and filter circuit 20 is first adjusted to make the voltage input to the negative terminal "c" of the voltage comparator circuit 30 lower than 5V when the ATE is connected to a 110V external AC voltage source, and higher than 5V when the ATE is connected to a 220V external AC voltage source. Then, the protection circuit 220 is connected to the ATE. A constant 5V reference voltage from the manostat Q1 is input to the positive terminal "d". When the ATE is correctly connected to the 110V AC, the voltage of the negative terminal "c" is lower than the positive terminal "d". The voltage comparator circuit 30 outputs a high lever to cause the Q5 to be closed and the annunciator 62 to disabled. Meanwhile, the Q3 is switched on, and the high lever voltage from the Q2 causes the Q4 to be switched on as well. The voltage from the voltage stabilizing circuit 40 can be input to the control circuit 240 of the ATE through the Q4. When the ATE is mistakenly connected to 220V AC, the voltage of the negative terminal "c" is higher than the positive terminal "d". The voltage comparator circuit 30 outputs a low lever voltage to cause the Q5 to be switched on, and the annunciator 62 to go into an alarm status. Simultaneously, the Q3 and the Q4 are closed, and the connection between the voltage stabilizing circuit 40 and the control circuit 240 is cut off.

Figure 5:
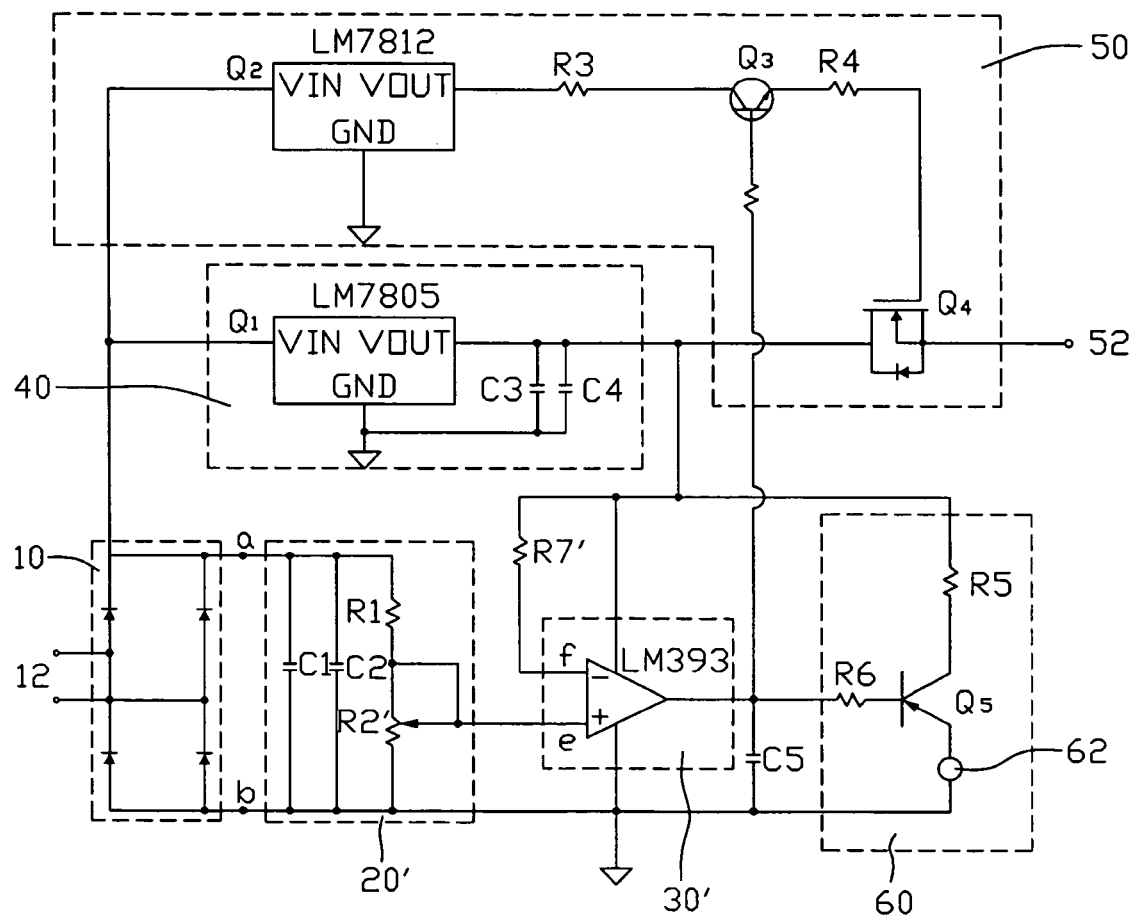
FIG. 5 is a circuit diagram of a protection circuit in accordance with an alternative embodiment of the present invention.

FIG. 5 illustrates the station where the protection circuit 220 is used for controlling a magnet valve 60 that functions normally when connected to 220V AC. The protection circuit 220 is set to function normally when connected to 220V AC, and goes into an alarm status when connected to 110V AC. The sliding terminal of the changeable resistor R2 is now connected to the positive terminal "e" of the comparator circuit 30. The voltage stabilizing circuit 40 outputs a constant 5V reference voltage passing through a resistor R7' to the negative terminal "f" of the voltage comparator circuit 30. Prior to connecting the protection circuit 220 to the ATE, the changeable resistor R2 of the sampler and filter circuit 20 is first adjusted to input voltage to the positive terminal "e" of the voltage comparator circuit 30 lower than 5V when the ATE is connected to 110V external AC, and higher than 5V when the ATE is connected to a 220V external AC. When the ATE is correctly connected to the 220V AC, the voltage of the negative terminal "f" is lower than the positive terminal "e". The voltage comparator circuit 30 outputs a high lever voltage to cause the Q5 to be closed and the Q3 and the Q4 to be switched on and the annunciator 62 to be disabled. The voltage from the voltage stabilizing circuit 40 can be input to the control circuit 240 of the ATE through the Q4. When the ATE is mistakenly connected to 110V AC, the voltage of the negative terminal "f" is higher than the positive terminal "e". The voltage comparator circuit 30 outputs a low lever voltage to cause the Q5 to be switched on, and the annunciator 62 to go into an alarm status. Simultaneously, the Q3 and the Q4 are closed, and the connection between the voltage stabilizing circuit 40 and the control circuit 240 is cut off.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. A protection circuit for avoiding the use of an improper alternating current (AC) source, comprising:

a rectifier circuit for receiving a voltage from an external AC power source and outputting a single-direction pulsed voltage;

a voltage comparator circuit having a first input terminal, a second input terminal and an output terminal, one of the input terminals being for receiving a constant reference voltage;

a sampler and filter circuit having an input terminal connected to an output terminal of the rectifier circuit, and an output terminal connected to the first input terminal of the voltage comparator circuit;

an alarm circuit connected to the output terminal of the voltage comparator circuit;

a switch control circuit enabled or disabled by means of a control signal received from the voltage comparator circuit; and a voltage stabilizing circuit having a manostat and two shunt-wound capacitors connected between the switch control circuit and ground.

2. The protection circuit for avoiding the use of an improper alternating current source as described in claim 1, wherein the switch control circuit comprises another manostat, a first transistor and a field effect transistor, the another manostat is connected to the collector electrode of the transistor, the base electrode of the first transistor receives a voltage from the voltage comparator circuit, the emitter electrode of the first transistor is connected to the grid electrode of the field effect transistor through a first resistor, the source electrode of the field effect transistor is connected to the output terminal of the voltage stabilizing circuit, and the output terminal of the protection circuit derives from the drain electrode of the field effect transistor.

3. The protection circuit for avoiding the use of an improper alternating current source as described in claim 2, wherein the output terminal of the protection circuit is connected to a control circuit of a piece of Automatic Test Equipment.

4. The protection circuit for avoiding the use of an improper alternating current source as described in claim 1, wherein the alarm circuit comprises a second transistor and an annunciator, the base electrode of the second transistor is connected to the output terminal of the voltage comparator circuit through a second resistor, the collector electrode of the second transistor is connected to the output terminal of the voltage stabilizing circuit through a third resistor, and the emitter electrode of the second transistor is connected to the input terminal of the annunciator.

5. The protection circuit for avoiding the use of an improper alternating current source as described in claim 1, wherein an input terminal of the voltage comparator circuit receiving a constant voltage is a positive terminal of the voltage comparator circuit, and an other input terminal is a negative terminal.

6. The protection circuit for avoiding the use of an improper alternating current source as described in claim 5, wherein the sampler and filter circuit comprises two capacitors, a fourth resistor for sharing voltage, and a changeable resistor, and a sliding terminal of the changeable resistor inputs a voltage to the negative terminal of the voltage comparator circuit.

7. The protection circuit for avoiding the use of an improper alternating current source as described in claim 1, wherein the input terminal of the voltage comparator circuit receiving a constant voltage is a negative terminal of the voltage comparator circuit, and another input terminal of the voltage comparator is a positive terminal.

8. The protection circuit for avoiding the use of an improper alternating current source as described in claim 5, wherein the sampler and filter circuit comprises two capacitors, a fourth resistor for sharing voltage, and a changeable resistor R2, and a sliding terminal of the changeable resistor outputs a voltage to the positive terminal of the voltage comparator circuit.

9. A protection circuit for avoiding the use of an improper alternating current (AC) source, comprising:
   a rectifier circuit for commutating the AC voltage to pulsed voltage;
   a sampler and filter circuit for transforming the pulsed voltage from the rectifier circuit to a direct current;
   a voltage stabilizing circuit for receiving a voltage from the rectifier circuit and outputting a constant voltage;
   a voltage comparator circuit having a first input terminal connected to the voltage stabilizing circuit and a second input terminal connected to the sampler and filter circuit;
   a switch control circuit for receiving a control signal output from the comparator to control the voltage stabilizing circuit output; and
   an alarm circuit connected between the comparator circuit and the voltage stabilizing circuit to provide an error warning.

10. The protection circuit for avoiding the use of an improper alternating current source as described in claim 9, wherein the switch control circuit comprises a first manostat, a first transistor and a field effect transistor, the first manostat is connected to the collector electrode of the first transistor, the base electrode of the first transistor receives a voltage from the voltage comparator circuit, and the emitter electrode of the first transistor is connected to the grid electrode of the field effect transistor through a first resistor, the source electrode of the field effect transistor is connected to the output terminal of the voltage stabilizing circuit, the output terminal of the protection circuit derives from the drain electrode of the field effect transistor.

11. The protection circuit for avoiding the use of an improper alternating current source as described in claim 9, wherein the sampler and filter circuit comprises two capacitors, a second resistor for sharing voltage, and a changeable resistor, and the sliding terminal of the changeable resistor outputs a voltage to one of the input terminals of the voltage comparator circuit.

12. The protection circuit for avoiding the use of an improper alternating current source as described in claim 10, wherein the voltage stabilizing circuit comprises a second manostat, and two shunt-wound capacitors connected between an output terminal of the second manostat and ground, the output terminal of the second manostat is connected to another input terminal through a third resistor.

13. The protection circuit for avoiding the use of an improper alternating current source as described in claim 12, wherein the alarm circuit comprises a second transistor and an annunciator, the base electrode of the second transistor is connected to the output terminal of the voltage comparator circuit through a fourth resistor, the collector electrode of the second transistor is connected to the output terminal of the voltage stabilizing circuit through a fifth resistor, the emitter electrode of the second transistor is connected to the input terminal of the annunciator.

14. A protection circuit comprising:
   a power source for providing input power;
   a sampler and filter circuit electrically connected to said power source for accepting said input power from said power source, and capable of providing a sample signal according to said input power, said sampler and filter circuit being adjustable to provide more than one sample signal;
   a voltage comparator circuit electrically connected to said sampler and filter circuit to accept said sample signal from said sampler and filter circuit so as to provide a control signal according to a comparative result between said sample signal and a predetermined value;
   a switch control circuit electrically connected to said voltage comparator circuit for accepting said control signal from said voltage comparator circuit so as to control provision of said input power to a target to be powered;
   a rectifier circuit for commutating said input power before said input power reaches said sampler and filter circuit; and
   a voltage stabilizing circuit for accepting said commutated input power from said rectifier circuit and capable of providing an output power with a constant voltage for said target.

15. The protection circuit as described in claim 14, wherein said sampler and filter circuit is capable of transforming said input power before said input power is further used to generate said sample signal.

* * * * *